United States Patent
Perry et al.

(10) Patent No.: US 7,235,143 B2
(45) Date of Patent: Jun. 26, 2007

(54) CONTROLLED-GRAIN-PRECIOUS METAL SPUTTER TARGETS

(75) Inventors: Andrew C. Perry, Oradell, NJ (US); Paul S. Gilman, Suffern, NY (US); Wendell Stuber, Pine Bush, NY (US); Binu Mathew, Spring Valley, NY (US)

(73) Assignee: Praxair S.T. Technology, Inc., North Haven, CT (US)

( * ) Notice: Subject to any disclaimer, the term of this patent is extended or adjusted under 35 U.S.C. 154(b) by 1 day.

(21) Appl. No.: 10/214,671

(22) Filed: Aug. 8, 2002

(65) Prior Publication Data

US 2004/0025986 A1   Feb. 12, 2004

(51) Int. Cl.
*C22C 5/04* (2006.01)

(52) U.S. Cl. ...................... 148/430; 420/466

(58) Field of Classification Search ............... 148/678, 148/430; 420/466
See application file for complete search history.

(56) References Cited

U.S. PATENT DOCUMENTS

| | | | |
|---|---|---|---|
| 4,083,220 A | 4/1978 | Kobayashi et al. | 72/364 |
| 4,159,217 A | 6/1979 | Selines et al. | 148/11.5 |
| 5,600,989 A | 2/1997 | Segal et al. | 72/253.1 |
| 5,766,380 A | 6/1998 | Lo et al. | 148/577 |
| 5,993,575 A | 11/1999 | Lo et al. | 148/577 |
| 5,993,621 A | 11/1999 | Liu | 204/298.12 |
| 6,139,701 A | 10/2000 | Pavate et al. | 204/192.17 |
| 6,197,129 B1 | 3/2001 | Zhu et al. | 148/400 |
| 6,238,494 B1 * | 5/2001 | Segal | 148/421 |
| 6,723,187 B2 * | 4/2004 | Segal et al. | 148/538 |
| 2001/0023726 A1 | 9/2001 | Koenigsmann et al. | 148/681 |

FOREIGN PATENT DOCUMENTS

| | | |
|---|---|---|
| EP | 799905 | 10/1997 |
| JP | 3115562 | 5/1991 |
| WO | 0015663 | 3/2000 |

OTHER PUBLICATIONS

Rigney et al., "Deformation Substructures Associated with Very Large Plastic Strains", Scripta Metallurgica, vol. 27 (1992) pp. 975-980.

Valiev et al., "Structure and Mechanical Behvior of Ultrafine-Grained Metals and Alloys Subjected to Intense Plastic Deformation", Physics of Metals and Metallography, vol. 85, No. 3 (1998) pp. 367-377.

(Continued)

*Primary Examiner*—Roy King
*Assistant Examiner*—Janelle Morillo
(74) *Attorney, Agent, or Firm*—Iurie A. Schwartz

(57) ABSTRACT

A precious metal sputter target has a composition selected from the group consisting of platinum, palladium, rhodium, iridium, ruthenium, osmium and single-phase alloys thereof. The sputter target's grain structure is at least about 99 percent recrystallized and has a grain size of less than about 200 μm for improving sputter uniformity. The cryogenic method for producing these sputter targets is also effective for improving sputter performance for silver and gold sputter targets.

4 Claims, 1 Drawing Sheet

OTHER PUBLICATIONS

Nakashima et al., "Influence of Channel Angle on the Development of Ultrafine Grains in Equal-Channel Angular Pressing", Acta Metallurgica, vol. 46, No. 5 (1998) pp. 1589-1599.

Shin et al., "Grain Refinement of a Commercial 0.15%C Steel by Equal-Channel Angular Pressing", Scripta Metallurgica, vol. 41, No. 3 (1999) pp. 259-262.

Tsuji et al., "Ultra-Fine Grained Bulk Steel Produced by Accumulative Roll-Bonding (ARB) Process", Scripta Metallurgica, vol. 40, No. 7 (1999) pp. 795-800.

Sun et al., "Characteristics of Submicron Grained Structure Formed In Aluminum by Equal Channel Angular Extrusion", Materials Science and Engineering (2000) pp. 82-85.

* cited by examiner

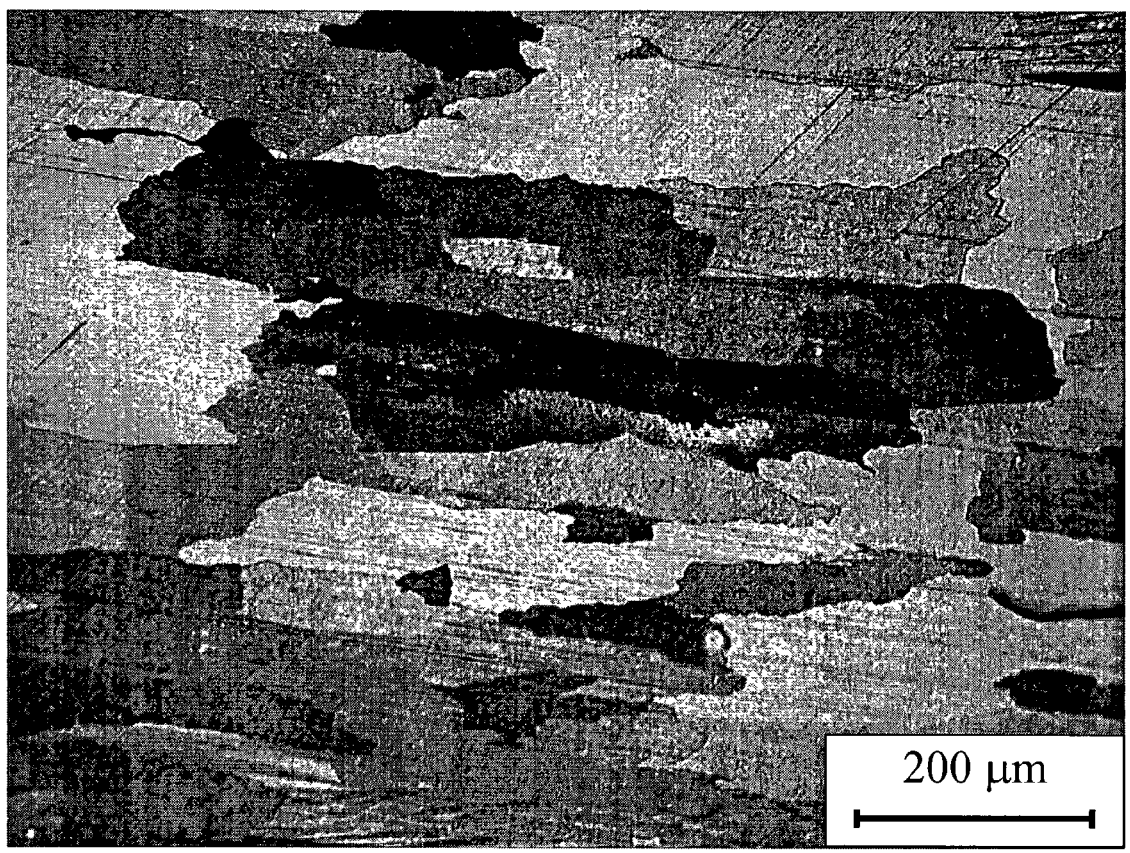
- Figure 1 -

CONTROLLED-GRAIN-PRECIOUS METAL SPUTTER TARGETS

FIELD OF THE INVENTION

This invention relates to the field of precious metal and precious metal alloy sputter targets and methods for manufacturing the sputter targets.

BACKGROUND OF THE INVENTION

Sputter target manufacturers have relied upon "as cast" as a low-cost method for producing precious metal sputter targets. In addition to this, manufacturers have relied upon conventional metalworking and annealing to produce precious metal sputter targets having a more uniform grain structure. Unfortunately, these techniques provide limited benefit for sputter target manufacturers. For example, typical rolled and annealed platinum group sputter targets have a grain size of about 300 to 5000 μm.

Target manufacturers have relied upon equal channel angular extrusion (ECAE) to produce fine grain microstructures. Nakashima et al., "Influence of Channel Angle on the Development of Ultrafine Grains in Equal-Channel Angular Pressing," Acta. Mater., Vol. 46, (1998), pp. 1589–1599 and R. Z. Valiev et al., "Structure and Mechanical Behavior of Ultrafine-Grained Metals and Alloys Subjected to Intense Plastic Deformation," Phys. Metal. Metallog., Vol. 85, (1998), pp. 367–377 provide examples of using ECAE to reduce grain size. ECAE introduces an enormous strain into a metal without imparting significant changes in workpiece shape. In fact sputter target manufacturers have claimed an ability to use ECAE to reduce the grain size of high-purity copper sputter targets to less than 5 μm. Although this process is effective for reducing grain size, it does not appear to align grains in a manner that facilitates uniform sputtering or provide an acceptable yield—the low yield originates from the ECAE process operating only with rectangular shaped plate; and thus, requiring an inefficient step of cutting circular targets from the rectangular plate.

Zhu, et al., in U.S. Pat. No. 6,197,129 B1, entitled "Method for Producing Ultrafine-Grained Materials using Repetitive Corrugation and Straightening" disclose a method for reducing grain size by intense redundant strains. Unfortunately, the repeated reversing bending strains would likely produce severe strains at the workpiece surfaces, while imparting only limited strains to the workpiece's mid-thickness regions, causing a gradient in material microstructure from surface to mid-thickness. These material property gradients are not suitable for sputter targets, as through-thickness property uniformity is a critical factor for consistent performance of a sputter target.

Lo, et al., in U.S. Pat. No. 5,766,380, entitled "Method for Fabricating Randomly Oriented Aluminum Alloy Sputtering Targets with Fine Grains and Fine Precipitates" disclose a cryogenic method for fabricating aluminum alloy sputter targets. This method uses cryogenic processing with a final annealing step to recrystallize the grains and control grain structure. Similarly, Y. Liu, in U.S. Pat. No. 5,993,621, uses cryogenic working and annealing to manipulate and enhance crystallographic texture of titanium sputter targets.

SUMMARY OF THE INVENTION

The invention provides a precious metal sputter target having a composition selected from the group consisting of platinum, palladium, rhodium, iridium, ruthenium, osmium and single-phase alloys thereof. The sputter target has a grain structure that is at least about 99 percent recrystallized and a grain size of less than about 200 μm for improving sputter uniformity.

The method of the invention forms sputter targets by first cooling a target blank to a temperature of less than about −50° C. The target blank has grains with an initial grain size and a composition selected from the group consisting of platinum, palladium, rhodium, iridium, ruthenium, osmium, silver, gold and single-phase alloys thereof. Then deforming the cooled target blank introduces strain into the target blank and forms a deformed grain structure. Recrystallizing the deformed grain structure forms a target blank having recrystallized grains. The target blank has at least about 99 percent recrystallized grains with the recrystallized grains having a fine grain size smaller than the initial grain size. Finally finishing the target blank forms a finished sputter target at a low temperature sufficient to maintain the fine grain size of the finished sputter target.

BRIEF DESCRIPTION OF THE FIGURE

FIG. 1 is a photomicrograph of fine-grained platinum having a grain size of 79 microns.

DETAILED DESCRIPTION

It has been discovered that lowering deformation temperature of precious metals and single phase precious metal alloys to at least −50° C. lowers the temperature of the recrystallization event and results in a fine grain size. For purposes of this specification, precious metals consist of platinum, palladium, rhodium, iridium, ruthenium, osmium, silver and gold. Then heating the target blank to a recrystallization temperature less than that normally used for ambient-temperature worked metal stabilizes the fine microstructure with a minimum amount of grain growth. This process produces a fine-grained-recrystallized structure having excellent stability at temperatures encountered during sputtering.

In particular, the process for manufacturing the precious metal targets first introduces severe plastic straining at cryogenic temperatures with the intent of increasing the number of viable new grain nucleation sites for subsequent activation during a low-temperature recrystallization annealing treatment. This increases the number of nuclei (N) from intense plastic deformation, reduces the subsequent growth rate (G) of the new grains and results in a reduced recrystallized grain size.

The cryogenic process exploits reduced grain boundary mobility by forcing the recrystallization event to occur at low temperatures. Hence, cryogenic working maximizes the ratio of N to G by both the intense plastic straining and retarded dynamic recovery associated with deformation at cryogenic temperatures (increasing N), and the reduced growth rate of newly formed grains by allowing recrystallization to occur at lower temperatures (reducing G). Maximizing the ratio of N to G allows minimization of the recrystallized grain size. Then controlling grain growth during subsequent processing of the target blank into a finished sputter target maintains the resulting minimum grain size.

The broad application of lower-than-normal deformation temperatures by immersing target blanks into cooling baths immediately prior to forming operations achieves a highly worked deformed state. Then annealing at low temperatures, produces new fully recrystallized grains of relatively small size that replace the deformed grains.

Most advantageously, the method includes the optional steps of first deforming the target blank to store the requisite energy required to recrystallize the precious metal. And second, recrystallizing the target blank improves uniformity of the grain structure before initiating the cooling, cryogenic working and low-temperature annealing sequence.

This process produces both precious metal and single-phase precious metal alloy sputter targets having at least about 99 percent of the sputter target recrystallized. For purposes of this specification, high purity refers to precious metal having a purity of at least 99.9 percent by weight; and single phase alloys refer to precious metal alloys containing predominantly a precious metal. This specification refers to all compositions by weight percent, unless specifically expressed otherwise. This process is effective for precious metal targets having a purity of at least 99.9 weight percent. In addition, this process is useful for targets having a purity of at least 99.99 weight percent and most advantageously as high as 99.9999 weight percent. For single phase precious metal alloys, the alloy most advantageously contains less than ten weight percent non-precious metal constituent by weight percent.

The finished grains for the platinum group metals (platinum, palladium, rhodium, iridium, ruthenium and osmium) have a grain size of less than about 200 μm. This represents a significant improvement in grain size over conventional platinum group metal targets. Furthermore, this process can advantageously maintain grain size to levels less than about 100 μm for the platinum group metals. Most advantageously, this process maintains grain size at levels of about 0.3 to 90 μm for platinum group metals. Cryogenic processing generally produces finer grains for silver and gold sputter targets than that achieved for the platinum group metals.

For purposes of this specification, orientation ratio defines the relative proportion of a particular grain orientation in relation to total grains, expressed in percent as measured perpendicular a sputter target's face. For example, measuring the intensity of an x-ray peak and dividing it by the relative intensity of that peak measured in a random orientation powder standard calculates grain orientation ratio. This ratio is then multiplied by 100 percent and normalized, i.e. divided by the sum of all grain orientation ratios between the intensities and their corresponding relative intensities.

For face centered cubic precious metals, such as platinum, palladium, rhodium, iridium, silver and gold, the finished sputter target face advantageously has a grain orientation ratio of at least about ten percent of each of the (111), (200), (220) and (311). Most advantageously, the finished sputter target face has a grain orientation ratio of at least about fifteen percent of each of the (111), (200), (220) and (311) for the face centered cubic precious metals. This balanced combination of (200), (111), (220) and (311) orientation ratios provides the most uniform sputter properties. In addition to this, the face centered cubic target advantageously has at least thirty percent (200) for improved sputter performance. And most advantageously, it has at least forty percent (200) or close packed direction.

First cooling a high-purity target blank to a temperature of less than about −50° C. prepares the blank for deformation. The cooling medium may be any combination of solid or liquid $CO_2$, liquid nitrogen, liquid argon, helium, or other supercooled liquid. Advantageously, the process lowers the blank to about −80° C. Most advantageously, the process cools the blank to at least about −196° C. or 77 K. The most practical temperature for most applications is 77 K (liquid nitrogen at atmospheric pressure).

After cooling, deforming the cooled high-purity target blank introduces intense strain into the high-purity target blank. The deforming process may include processes such as, pressing, rolling, forging to form a deformed grain structure and to subsequently achieve fine grain sizes upon low-temperature annealing. During deformation, it is important to limit heating of the target blank. Furthermore, it is advantageous to enter an engineering strain of at least about 50 percent into the target blank. This strain ensures uniform microstructure through the target's thickness.

Rolling has proven to be the most advantageous method for reducing grain size and achieving the desired texture. In particular, multiple pass rolling, with re-cooling to cryogenic temperatures at least once between passes provides the most advantageous results. Most advantageously, the re-cooling occurs between each pass. But for some applications, re-cooling after every second pass is sufficient.

The grains in the target blank recrystallize at a temperature that is lower than that exhibited by grains that have been worked at ambient temperatures. At these lower recrystallization temperatures, still at least about 99 percent of the grains recrystallize. As discussed above, minimizing the recrystallization temperature reduces the target's grain size. Advantageously, the recrystallizing occurs at a temperature between about 150 and 500° C. For platinum sputter target blanks, the recrystallizing advantageously occurs at a temperature between about 400 and 550° C. For palladium sputter target blanks, the recrystallizing advantageously occurs at a temperature between about 500 and 650° C.

The finishing of the high-purity target blank into a finished sputter target occurs at a temperature sufficient to maintain the fine grain size. If the sputter target is finished at too high of a temperature, then the beneficial grain size reduction is lost. Advantageously, the finishing occurs at a temperature less than about 200° C. to limit grain growth. Reducing finishing temperature to less than about 100° C. further decreases grain growth during finishing. Most advantageously, the finishing occurs at ambient temperature.

EXAMPLE 1

A billet of 99.99% pure platinum was cast into a 89 mm (3.5 in) diameter×152 mm (6.0 in) long cylindrical graphite mold. The billet was hot upset pressed 67% reduction in height after being reheated to 800° C. The pressed billet was then reheated to 800° C. and hot cross-rolled to a thickness of 38 mm (1.5 in) and allowed to cool to room temperature. The slab of platinum was then further cross rolled at ambient temperature to a final thickness of 17 mm (0.650 in). The ambient-temperature-rolled slab was annealed at 600° C. for two hours to facilitate recrystallization. The recrystallized blank was then subjected to cryogenic cross rolling. In the cryogenic cross rolling step, an operator immersed the workpiece in liquid nitrogen until visible boiling of the liquid nitrogen was no longer observed; the workpiece was then at a temperature of approximately 77 K or −196° C. Re-cooling the cryogenically rolled slab between each rolling pass ensured that the imposed deformation took place at a temperature as close to −196° C. or 77 K as reasonably possible.

After pre-cooling was complete, rolling the platinum workpiece at 1 mm (0.04 in) per pass was conducted until reaching a final thickness of 51 mm (0.20 in). In between rolling passes, immediately transferring the workpiece into the liquid nitrogen bath prevented the temperature of the workpiece from exceeding approximately −80° C. This facilitated retaining the maximum stored strain energy imparted by the rolling passes. In addition, rotating the target blank ninety degrees with each pass or "cross rolling" facilitated the formation of a fully recrystallized and balanced grain structure after annealing.

A recrystallization heat treatment at 475° C. for 2 hours causes the deformed structure of the intensely strained workpiece to be replaced with new, relatively fine grains depicted in FIG. 1 (grain size of 79 microns). The orientation ratios measured from the fine-grain platinum sample of the present example are listed in Table 1 below.

TABLE 1

Orientation Ratios of Fine Grain Platinum

| <111> | <200> | <220> | <311> |
|---|---|---|---|
| 15.2 | 47.6 | 15.6 | 21.6 |

EXAMPLE 2

Using a process similar to that described in Example 1, a billet of 99.99% pure palladium was subjected to thermomechanical processing that included cryogenic deformation and low temperature annealing. The wrought palladium sample was cryogenically cross rolled as described in the previous example, using a bath of liquid nitrogen as the cooling medium. After 66% cryogenic rolling strain, the sample was annealed for one hour at 600° C. The finished material grain size was fully recrystallized and measured to be 33 microns, using ASTM E-112-96 grain size determination procedures.

The process can fabricate targets of any shape including circular-shaped targets and sheet-like-rectangular-shaped targets. With the cryogenic process, it's possible to achieve minimum grain sizes as fine as 10 to 100 µm in pure precious metal targets, such as platinum and palladium targets having a purity of at least 99.99 weight percent. Furthermore, reducing grain size improves sputter uniformity in comparison to conventional high-purity sputter targets that are most-often annealed at higher temperatures. In addition, the process provides a more consistent product than conventional wrought methods. Finally, the target contains a fully recrystallized-textured grain with a balanced orientation ratio that further facilitates uniform sputtering.

Although the invention has been described in detail with reference to certain preferred embodiments, those skilled in the art will recognize that there are other embodiments of the invention within the spirit and the scope of the claims.

We claim:

1. A precious metal sputter target, the sputter target having a platinum alloy composition and a grain structure, the grain structure being at least about 99 percent recrystallized and having a grain size of less than about 200 µm and a face centered grain orientation in the (111), (200), (220) and (311) directions for improving sputter uniformity, the sputter target has a grain orientation ratio of at least about 10 percent each of the (111), (200), (220) and (311).

2. The sputter target of claim 1 wherein the sputter target has a purity of at least 99.9 weight percent.

3. A precious metal sputter target, the sputter target having a platinum alloy composition and a grain structure, the grain structure being at least about 99 percent recrystallized and having a grain size of less than about 100 µm for improving sputter uniformity the sputter target has a sputter target face and a grain orientation ratio of at least about 10 percent each of the (111), (200), (220) and (311).

4. The sputter target of claim 3 wherein the sputter target has a purity of at least 99.9 weight percent.

* * * * *